(12) United States Patent
Strijker et al.

(10) Patent No.: US 9,543,288 B2
(45) Date of Patent: Jan. 10, 2017

(54) SEMICONDUCTOR ISOLATION STRUCTURE

(71) Applicant: NXP B.V., Eindhoven (NL)

(72) Inventors: Joan Wichard Strijker, Nijmegen (NL); Inesz Marycka Emmerik-Weijland, Malden (NL)

(73) Assignee: NXP B.V., Eindhoven (NL)

( * ) Notice: Subject to any disclaimer, the term of this patent is extended or adjusted under 35 U.S.C. 154(b) by 101 days.

(21) Appl. No.: 14/672,601

(22) Filed: Mar. 30, 2015

(65) Prior Publication Data

US 2015/0294965 A1    Oct. 15, 2015

(30) Foreign Application Priority Data

Apr. 11, 2014   (EP) .................... 14164475

(51) Int. Cl.
  *H01L 23/62*     (2006.01)
  *H01L 27/02*     (2006.01)
  *H01L 29/866*    (2006.01)
  *H05K 1/02*      (2006.01)
  *H02H 9/04*      (2006.01)
  *H01L 29/87*     (2006.01)
  *H01L 21/8238*   (2006.01)

(52) U.S. Cl.
  CPC ......... *H01L 27/0248* (2013.01); *H01L 29/866* (2013.01); *H01L 21/823878* (2013.01); *H01L 27/0255* (2013.01); *H01L 29/87* (2013.01); *H02H 9/046* (2013.01); *H05K 1/0259* (2013.01)

(58) Field of Classification Search
  USPC ............................ 361/56, 111; 257/355–360
  See application file for complete search history.

(56) References Cited

U.S. PATENT DOCUMENTS

| | | |
|---|---|---|
| 6,664,608 B1 | 12/2003 | Burr |
| 2004/0052019 A1* | 3/2004 | Liu ............... H01L 27/0266 361/56 |

(Continued)

FOREIGN PATENT DOCUMENTS

EP    1 233 447 A2    8/2002

OTHER PUBLICATIONS

Extended European Search Report for EP Patent Appln. No. 14164475.7 (Jul. 14, 2014).

*Primary Examiner* — Danny Nguyen

(57) ABSTRACT

The invention relates to a semiconductor isolation structure. More particularly, the present invention relates to a semiconductor isolation structure suitable for providing high voltage isolation. Embodiments disclosed include a semiconductor structure (10) comprising: a first semiconductor region (R1), a second semiconductor region (R2) within the first semiconductor region (R1), and a voltage isolator (11) separating the first and second semiconductor regions (R1, R2), the voltage isolator (11) comprising: a nested series of insulating regions (T1, T2) around the perimeter of the second semiconductor region (R2), an intermediate semiconductor region (I1, I2) between each adjacent pair of nested insulating regions (T1, T2), and a voltage control device (12) comprising a conducting element (D1-D3) connected to at least one intermediate semiconductor region (I1, I2) in parallel with the at least one insulating region (T1, T2), so as to control a voltage across the at least one insulating region (T1, T2).

15 Claims, 11 Drawing Sheets

(56) References Cited

U.S. PATENT DOCUMENTS

| 2007/0176220 A1 | 8/2007 | Takahashi et al. |
| 2009/0101937 A1* | 4/2009 | Lee .................... H01L 27/0255 |
| | | 257/137 |
| 2010/0314710 A1 | 12/2010 | Yamaji |
| 2014/0001567 A1 | 1/2014 | McPatlin |

* cited by examiner

SEMICONDUCTOR ISOLATION STRUCTURE

CROSS-REFERENCE TO RELATED APPLICATIONS

This application claims the priority under 35 U.S.C. §119 of European patent application no. 14164475.7, filed on Apr. 11, 2014, the contents of which are incorporated by reference herein.

The invention relates to a semiconductor isolation structure. More particularly, the present invention relates to a semiconductor isolation structure suitable for providing high voltage isolation.

In integrated circuits it is often necessary to electrically isolate adjacent components from each other. One way in which such isolation can be achieved is junction isolation, in which a reverse biased p-n junction is used to create an electrically isolated region, or well, around a component. An alternative approach is to use an insulating material, such as a silicon oxide, to isolate various regions of semiconductor from each other.

One technique for forming insulating structures to isolate regions of semiconducting material from each other is to define a trench in a semiconductor material, and then to form an insulating material in the trench. For example, a deep reactive ion etch may be used to form the trench, and a thermal oxidation process used to form the insulating material. The trench may subsequently be re-filled and planarised (e.g. by chemical mechanical polishing), so that further layers can be deposited over it.

Such trench isolation structures are typically capable of standing off a limited voltage. The maximum standoff voltage is typically determined by the breakdown voltage of the structure, which will be affected by the thickness of the insulator in the trench and the geometry of the trench.

In some circumstances, it is desirable to isolate regions of semiconductor with a relatively large voltage difference therebetween, which may not exceed the maximum isolation voltage for an existing isolation structure (such as a trench isolation). Although it may be possible to modify the design of the isolation structure to be suitable for a higher voltage, or to include a different, high voltage isolation structure, it is generally highly desirable to avoid the cost associated with modifying semiconductor processes.

One way of providing high voltage isolation in a semiconductor material is to separate devices with a drift region of the semiconductor material. When high voltages are isolated using this technique, the size of the drift region tends to be relatively large. For example, a drift region of over 100 μm may be necessary for 700V isolation. A 100 μm wide drift region around the perimeter of a high voltage region consumes a relatively large amount of die area, which is costly. A high voltage isolation structure with a smaller footprint would be preferable.

US2010/0314710 discloses the use of three concentric, nested isolation trenches to provide isolation for high voltages.

It would be desirable to improve on the properties of prior art isolation structures. Improvements in reliability and scalability are desired.

According to a first aspect of the invention, there is provided a semiconductor structure comprising: a first semiconductor region, a second semiconductor region within the first semiconductor region, and a voltage isolator separating the first and second semiconductor region, the voltage isolator comprising: a nested series of insulating regions around the perimeter of the second semiconductor region, an intermediate semiconductor region between each adjacent pair of nested insulating regions, and a voltage control device comprising a conducting element connected to at least one intermediate semiconductor region, in parallel with at least one insulating region, so as to control a voltage across the at least one insulating region.

The voltage control device may help to define the voltage across each insulating region, for instance by preventing at least one intermediate region from having a floating voltage, or by limiting a voltage across at least one intermediate region to a breakdown voltage of the conducting element.

If the voltage of an intermediate region is allowed to float (as in US2010/0314710), the voltage steps between each semiconductor region will not necessarily be uniform. This is because the voltage dropped across a series of capacitors will distribute itself in inverse proportion to each capacitance.

The mutual capacitance between each adjacent semiconductor region is unlikely to be equal (for example because they are nested, and therefore have different surface area), and hence the voltage drop over each insulating region will tend to be unequal. Connecting a conducting element in parallel with at least one intermediate semiconductor region allows the voltage across the at least one insulating region to be controlled, thereby improving the reliability of the isolation structure.

The isolation structure may be suitable for isolating high voltages, for example, in excess of 100V, 200V, 300V, 400V, 500V, 750V or 1000V. The voltage of the first region may be higher than the voltage of the second region, or the voltage of the second region may be higher than the voltage of the first region. The voltage control device may be arranged to control the voltage in either of these cases (or both).

As a greater number of insulating regions are nested together, to provide for higher voltage isolation the problem of non-uniform voltage steps over each individual insulating region is compounded. Some embodiments of the invention therefore improve the scalability of a nested isolation structure by providing a mechanism to improve the uniformity of the voltage differences over each insulating region. Embodiments of the invention provide for a scalable voltage isolation in which additional insulating regions may simply be added to increase the voltage isolation to an arbitrary amount.

It will be understood that an improvement can be obtained even where some of the intermediate semiconductor regions are allowed to float. For example, defining the voltage of alternate intermediate regions, and allowing intervening intermediate regions to float, will still improve the uniformity of the voltage steps over each insulating layer. Similarly, controlling the voltage of a single (for instance, central) intermediate region may effectively reduce the problems of non-uniform voltage distribution across an isolation structure.

The voltage control device may comprise a conducting element connected in parallel with each insulating region, so as to control the voltage across each insulating region. The voltage control device may comprise a plurality of conducting elements connected in series, each conducting element being connected in parallel with a corresponding insulating region, the voltage control device being connected at a first location to the first region, at a second location to the second region, and having intermediate connections between the first and second location to each intermediate semiconductor region. Such an arrangement allows the voltage across each insulating region to be controlled.

For instance, where each conducting element is a Zener diode (or a series combination of Zener diodes), the voltage across each insulating region will be limited to the breakdown voltage of the Zener diode.

Alternatively, each conducting element may be a resistor, and the voltage control device may be a potential divider that defines the voltage of each intermediate semiconductor region. Providing a controlled current leakage path in parallel with each insulating region means that the voltage across each insulating region is defined.

The voltage control device may be at least partly defined in at least one of: the first semiconductor region, an intermediate semiconductor region and the second semiconductor region. For instance, a conducting element (e.g. a Zener diode) may be formed in each intermediate region, and a further conducting element formed in either (or both of) the first or second region, thereby providing a conducting element corresponding with each insulating region.

The first and second semiconductor region may be defined in the same semiconductor layer. The semiconductor layer may comprise: a bulk semiconductor material (e.g. silicon), a silicon on insulator layer or a semiconductor on insulator layer.

Each non-conducting region may comprise a trench isolation structure. The trench isolation structure may be through a full thickness of the semiconductor layer. Such an arrangement may be particularly suitable for high voltage applications.

Each conducting element may comprise a resistor. Each conducting element may have a relatively high resistance, so as to limit any current leakage when a voltage bias exists between the first and second region.

Each conducting element may comprise a diode, or a plurality of diodes connected in series. The threshold voltage of a single diode may be below the limit voltage of the dielectric region.

The voltage divider may comprise a plurality of diodes. A diode under reverse bias exhibits a breakdown voltage at which the current suddenly increases due to at least one of the Zener effect or avalanche breakdown effect. Diodes may therefore be used to limit the voltage step between the first end of the voltage divider and the intermediate connection, and between the intermediate connection and the second end of the voltage divider. Connecting diodes in series increases the effective breakdown voltage for the series of diodes, taken together. The (or each) diode may comprise a Zener diode. Zener diodes are configured to have a controlled breakdown voltage, and to allow current through the device to keep the voltage across the diode at the Zener (or breakdown) voltage.

According to a second aspect of the invention, there is provided a semiconductor device comprising the semiconductor structure according to the first aspect of the invention, wherein the semiconductor structure is configured as: a high voltage Zener diode, or a high voltage clamp. Embodiments of the first aspect are particularly suitable for providing a high voltage Zener diode or high voltage clamp.

According to a third aspect of the invention, there is provided an electronic apparatus comprising the semiconductor device according to the second aspect.

The apparatus may comprise an integrated circuit for discharging a mains filtering capacitor, and the semiconductor device according to the second aspect may be configured to protect the integrated circuit from overvoltage damage due to mains surge. The semiconductor device may be integrated on a single die with the integrated circuit for discharging the mains filtering capacitor, thereby providing a lower cost solution than protecting such a device using an external component, such as a metal oxide varistor. Any integrated circuit that needs to be protected from high voltages may include a semiconductor device according to the second aspect, for instance configured as a voltage clamp.

According to a fourth aspect of the invention, there is provided a method of fabricating the device according to the first or second aspect of the invention, comprising: providing a semiconductor layer; defining a first and second semiconductor region of the semiconductor layer by forming a voltage isolator around a perimeter of the second semiconductor region, separating it from the first semiconductor region, the voltage isolator comprising a nested series of isolating regions, with an intermediate region of the semiconductor layer between each adjacent pair insulating regions; defining a voltage control device comprising a conducting element connected to at least one intermediate semiconductor region, in parallel with at least one insulating region, so as to control a voltage across the at least one insulating region.

In some embodiments the method may provide for a low cost, scalable high voltage isolation structure that can be included with minimal process modification to facilitate high voltage functionality in an integrated circuit.

Embodiments of the invention will now be described, by way of example only, with reference to the accompanying drawings, in which.

Figure 1:
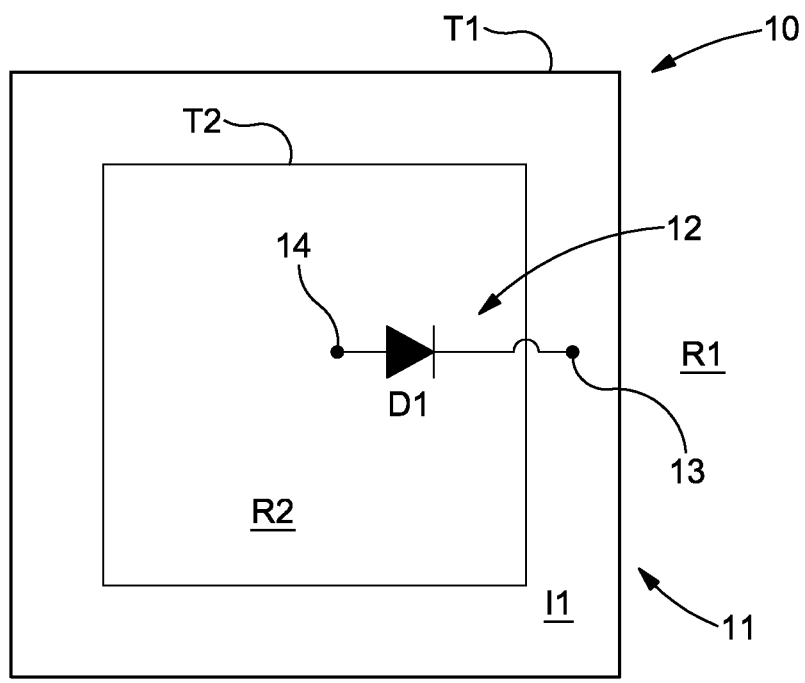
FIG. 1 is a schematic layout of a first embodiment, in which the voltage control device comprises a diode.

Referring to FIG. 1, a semiconductor structure 10 is shown, comprising a first semiconductor region R1, a second semiconductor region R2, and a voltage isolator 11 separating the first and second semiconductor region R1, R2. The second semiconductor region R2 is within the first semiconductor region R1, and the voltage isolator 11 surrounds the second region R2.

The voltage isolator 11 comprises a nested series of insulating regions T1, T2 around the perimeter of the second semiconductor region R2. Between the two insulating regions T1, T2 is an intermediate semiconductor region I1. The voltage isolator 11 further comprises a voltage control device 12 comprising a conducting element, which in this embodiment is a diode D1. The diode D1 is connected at a first end 14 to the second semiconductor region R2, and at a second end 13 to the intermediate semiconductor region I1.

The diode D1 may be a Zener diode, which will break down when a sufficiently large reverse bias voltage is present between the anode and the cathode thereof. The voltage between the second semiconductor region R2 and the intermediate semiconductor region I1 is thereby limited to the breakdown voltage of the diode D1. This can be used to prevent an unequal division of voltage across the two insulating regions T1 and T2. Although D1 is illustrated as a single diode, D1 may comprise more than one diode (such diodes are referred to herein as 'sub-diodes') connected in series, thereby providing an increased threshold voltage. For example the diode D1 may consist of a series of eight Zener sub-diodes, each with a threshold voltage of approximately 9.5V. The threshold voltage of the diode D1 would then be 76V. The diode D1 in FIG. 1 is arranged to be reverse biased when the voltage in the first region R1 is greater than the voltage in the second region R2, but this could be reversed so that the diode D1 is reverse biased when the voltage of the second region R2 is higher than the voltage of the first region R1.

The first and second semiconductor region R1, R2 and the intermediate semiconductor region I1 may be formed from a single semiconductor layer. The regions R1, R2 and I1 may comprise silicon, or another type of semiconductor material, such as a III-V semiconductor e.g. GaAs). The insulating regions T1, T2 may be trench isolation structures, formed by patterning a trench in the semiconductor layer, and at least partially filling or coating the interior with an insulator. Each trench T1, T2 may be formed by deep reactive ion etching, and the insulating material may comprise a thermal oxide (e.g. silicon oxide).

The p-n junction of the diode D1 may be formed in the second semiconductor region R2 or the first intermediate semiconductor region R1, using conventional semiconductor processing techniques.

Figure 2:
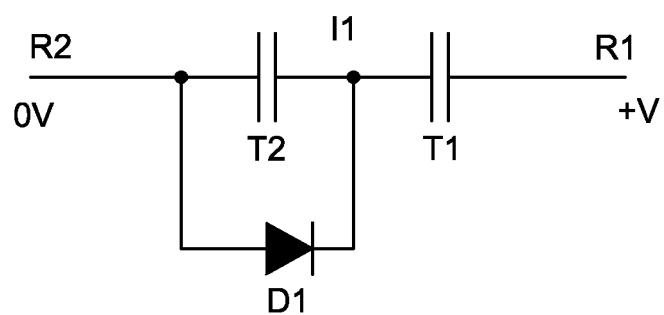
FIG. 2 is an equivalent circuit diagram of the first embodiment.

Referring to FIG. 2, an equivalent circuit of FIG. 1 is shown. The insulating regions T2, T1 are represented by capacitors between R2 and I1 and between I1 and R1 respectively. If the voltage control device 12 (comprising diode D1) were not present and R1 was at a higher voltage than R2, the voltage of the intermediate region I1 would float at a voltage determined by the relative capacitance of T1 and T2. If both capacitors T1 and T2 were equal, the voltage at 11 would be equal to half the voltage difference between R1 and R2. However, because the insulating regions T1 and T2 are nested T1 may have a larger capacitance resulting in an unequal distribution of voltage, with a higher voltage dropped across T2 than T1.

The voltage control diode D1 is arranged to control the voltage across T2, and may be configured with a threshold voltage just below the maximum stand-off voltage of the insulating region T2. The diode D1 will thereby prevent the voltage across T2 from exceeding the maximum stand-off voltage of the insulating region T2, because it will conduct current when the voltage across D1 reaches the threshold voltage. Injection of charge into the intermediate semiconductor region I1 will increase the voltage at I1, and therefore increase the voltage drop across T1. The excess voltage across T2 (above the threshold of the diode D1) is therefore re-distributed by the diode D1 across T1.

Figure 3:
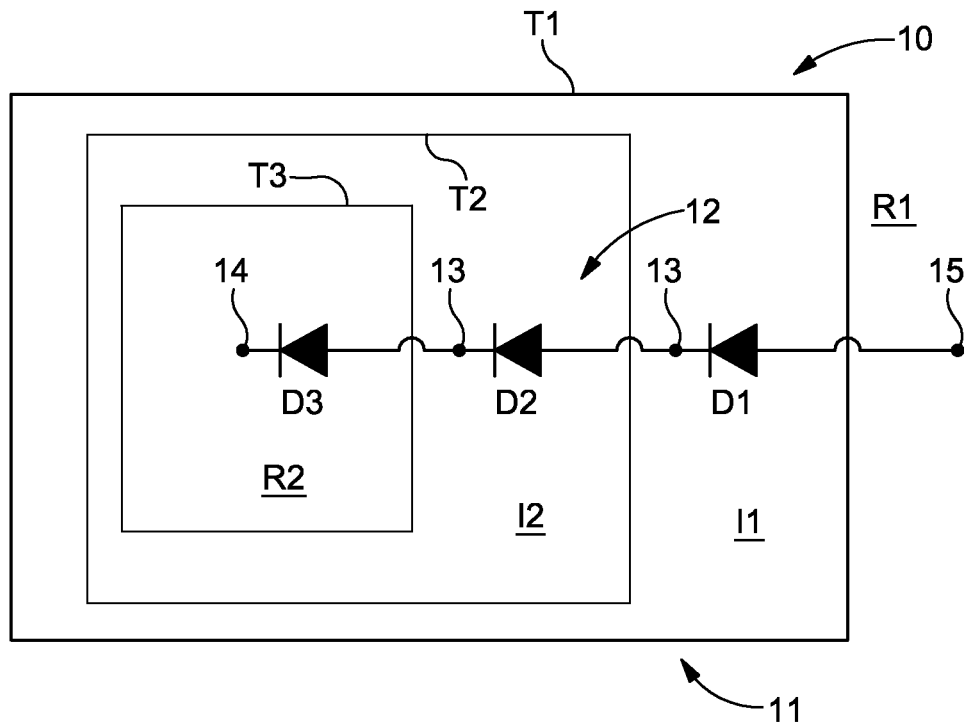
FIG. 3 is a schematic layout of a second embodiment, in which the voltage control device comprises a diode connected in parallel with each insulating region.
Figure 4:
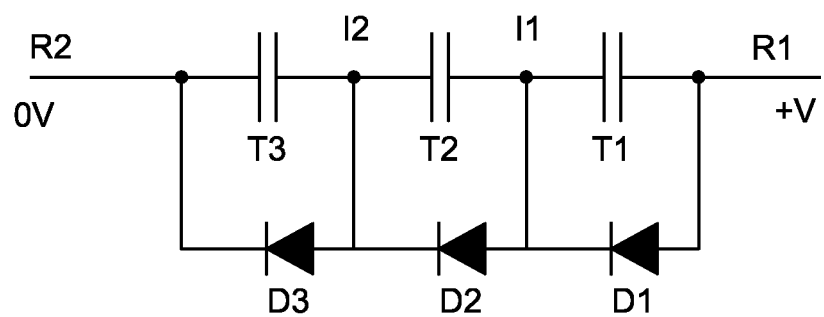
FIG. 4 is an equivalent circuit diagram of the second embodiment.

Referring to FIGS. 3 and 4, an alternative embodiment of a semiconductor structure 10 is shown in which the voltage isolator 11 comprises a series of three nested insulating regions T1, T2 and T3. A first intermediate semiconductor region I1 is defined between T1 and T2 and a second intermediate semiconductor region I2 is defined between T2 and T3. The voltage control device 12 comprises three diodes D1, D2, D3. Each diode D1, D2, D3 is respectively connected across, i.e. in parallel with, a corresponding insulating region T1, T2, T3. The diodes D1-D3 are also connected to each other in series. The voltage control device 12 is connected at a first end 15 to the first region R1, at a second end 14 to the second region R2, and has intermediate connections 13 to each intermediate semiconductor region I1, I2. The diodes D1-D3 are arranged to be reverse biased when the voltage of the second region R2 is greater than the voltage of the first region R1, but the direction of the diodes can be reversed in other embodiments.

The voltage across each of the insulating regions is controlled by the diode connected in parallel thereto. The maximum voltage across each insulating region T1-T3 is thereby limited by the threshold voltage of each diode D1-D3. This arrangement is scalable, and an arbitrary number of insulating regions and parallel connected diodes can be used to provide reliable voltage isolation for an arbitrary voltage.

Figure 5:
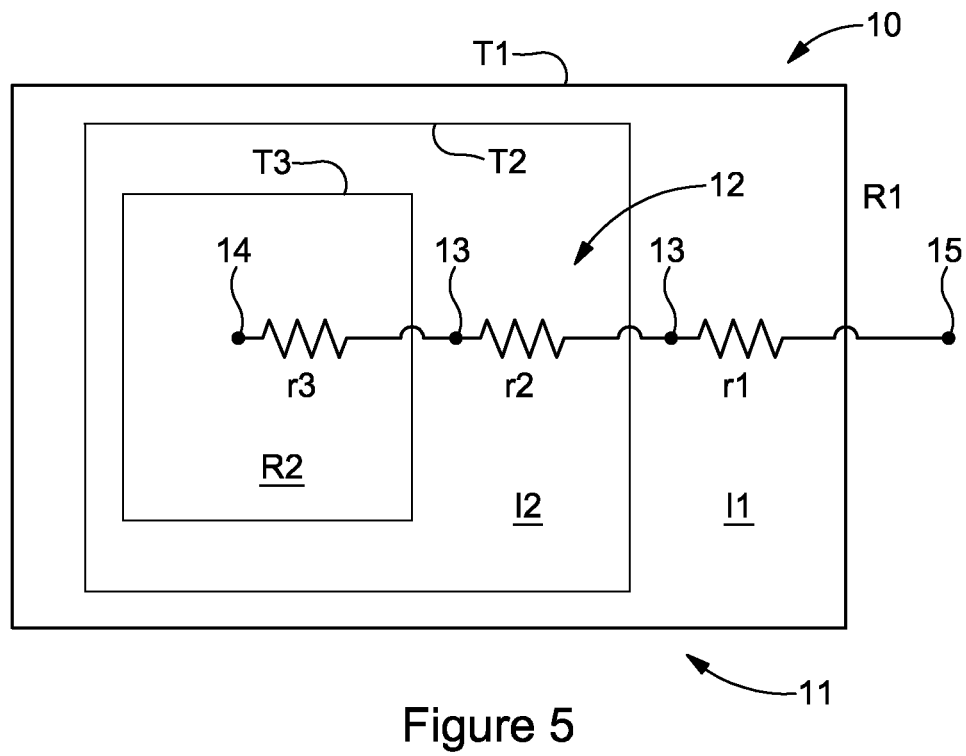
FIG. 5 is a schematic layout of a third embodiment in which the voltage control device comprises a resistor connected in parallel with each insulating region.
Figure 6:
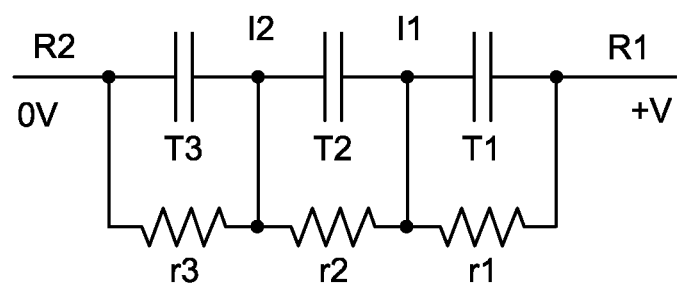
FIG. 6 is an equivalent circuit diagram of the third embodiment.

FIGS. 5 and 6 show an alternative embodiment of a semiconductor structure 10, in which the conducting elements of the voltage control device 12 comprise resistors r1-r3. In this arrangement there are again three insulating regions T1-T3, defining two intermediate semiconductor regions I1 and I2. The resistors r1-r3 of the voltage control device 12 are connected in series, and the voltage control device 12 is again connected at a first end 15 to the first region R1, at a second end 14 to the second region R2, and has intermediate connections 13 to each intermediate semiconductor region I1, I2. The resistors r1-r3 of the voltage control device thereby provide a voltage divider, which distributes the voltage of the otherwise floating intermediate regions I1 and I2 to a voltage that is defined by the ratio of the resistors. The resistors r1-r3 may all have substantially equal resistance, thereby fixing the voltage across each insulating region T1-T3 to be substantially the same. Each resistor r1-r3 may have a relatively large resistance, for example greater than 1 kohm or 1 Mohm, thereby limiting the leakage current through the voltage control device 12. Since resistors are not directional, this approach may be suitable for cases in which either the first or second region R1, R2 is at a high voltage.

Figure 7:
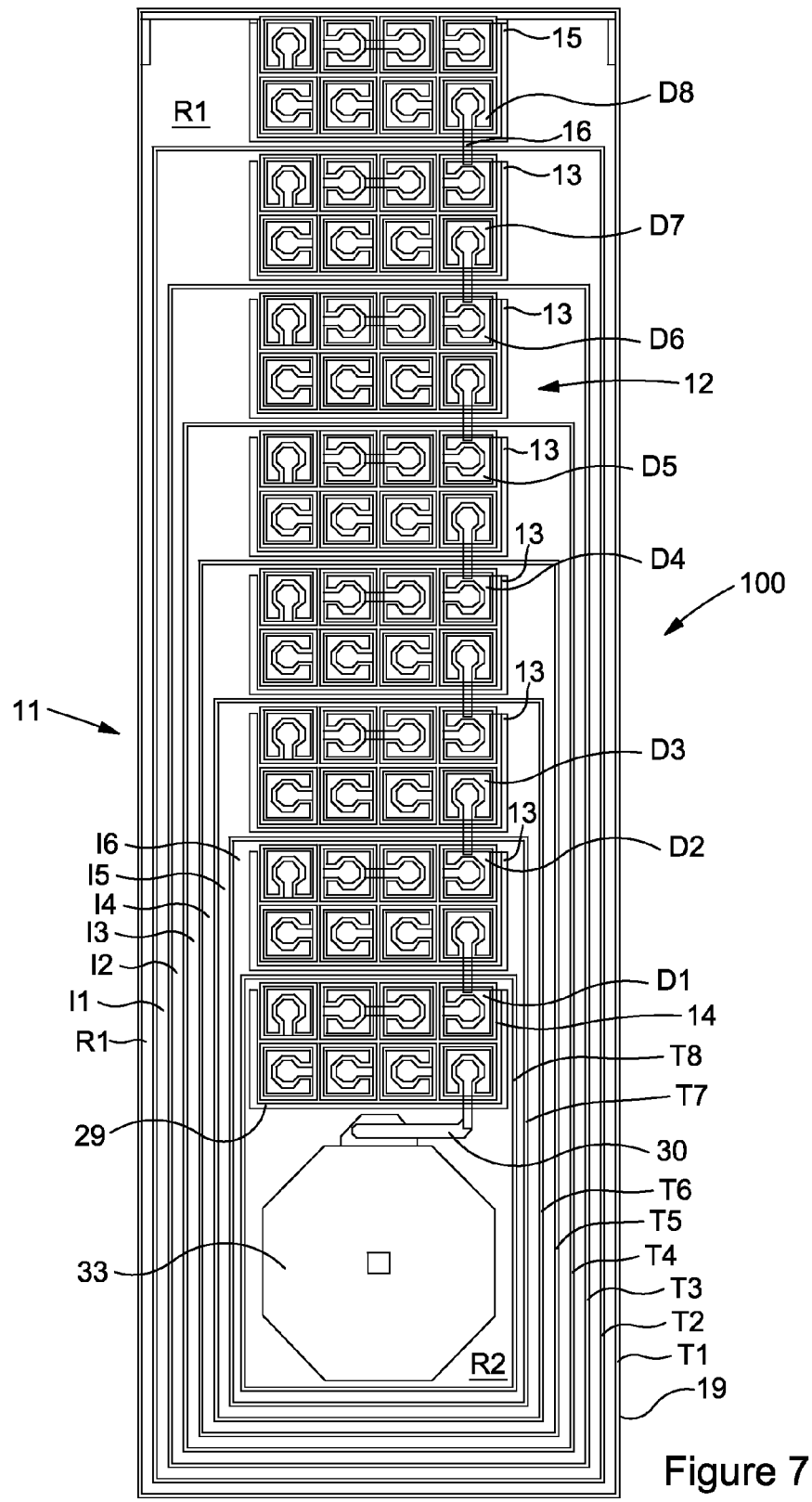
FIG. 7 is a schematic layout of a high voltage clamp according to a fourth embodiment of the invention.

FIG. 7 shows a schematic layout of a semiconductor structure 100 comprising a first semiconductor region R1 and a second semiconductor region R2 separated by a voltage isolator 11. For reasons of clarity, the layout of FIG. 7 (and of FIGS. 8 and 11) shows layers corresponding only to a first metal layer 29, a second metal layer 30, a third metal layer 33 and a trench isolation 19. More complete views of the layers of the semiconductor structure can be seen in the sectional drawings of FIGS. 9, 10 and 12.

The second region R2 is within the first region R1, and the first region R1 is surrounded by an insulating region T1. The first region R1 and second region R2 are separated by a voltage isolator 11, comprising seven nested insulating regions T2-T8. The voltage isolator 11 further comprises six intermediate semiconductor regions I1-I6, defined between the adjacent pairs of nested insulating regions T2-T8. The first and second semiconductor region R1, R2, and each intermediate semiconductor region I1-I6 are defined in the same semiconductor layer 22. The semiconductor layer 22 in this embodiment is a silicon on insulator layer, but the semiconductor structure may also be formed in bulk silicon, or in some other semiconductor material. In this embodiment each insulating region T1-T8 is a trench isolation structure, but other types of isolation structure may be used.

The voltage isolator 11 further comprises a voltage control device 12. The voltage control device 12 comprises a series of eight Zener diodes D1-D8. Each of Zener diodes D2-D8 is connected in parallel with a corresponding respective insulating region T8-T2. The diodes D1-D8 are connected to each other in series, and each diode D2-D7 has a connection 13 to at least one intermediate semiconductor region I1-I6. Diodes D1 and D2 are both connected to the second semiconductor region R2, and diode D8 is connected to the first semiconductor region R1.

Diode D1 is provided in the second region R2, connected at one end to the semiconductor region R2, and at the other end to a bondpad 33, which is electrically isolated from the semiconductor region R2 by at least one layer of insulating material (such as silicon oxide). Each of diodes D2-D7 is defined in a respective intermediate semiconductor region I6-I1.

Each of the diodes D1-D8 comprises a plurality of sub-diodes, connected in series. In this example, eight sub-diodes are used for each diode (thereby providing a diode with a threshold voltage eight times higher than each sub-diode). The appropriate number of sub-diodes in each diode D1-D8 depends on factors such as the threshold voltage of each diode D1-D8 and the desired maximum voltage across each insulation region 19. The threshold voltage of each sub-diode may be approximately 9.5V, and the threshold voltage of each diode is thereby approximately 76V.

Figure 8:
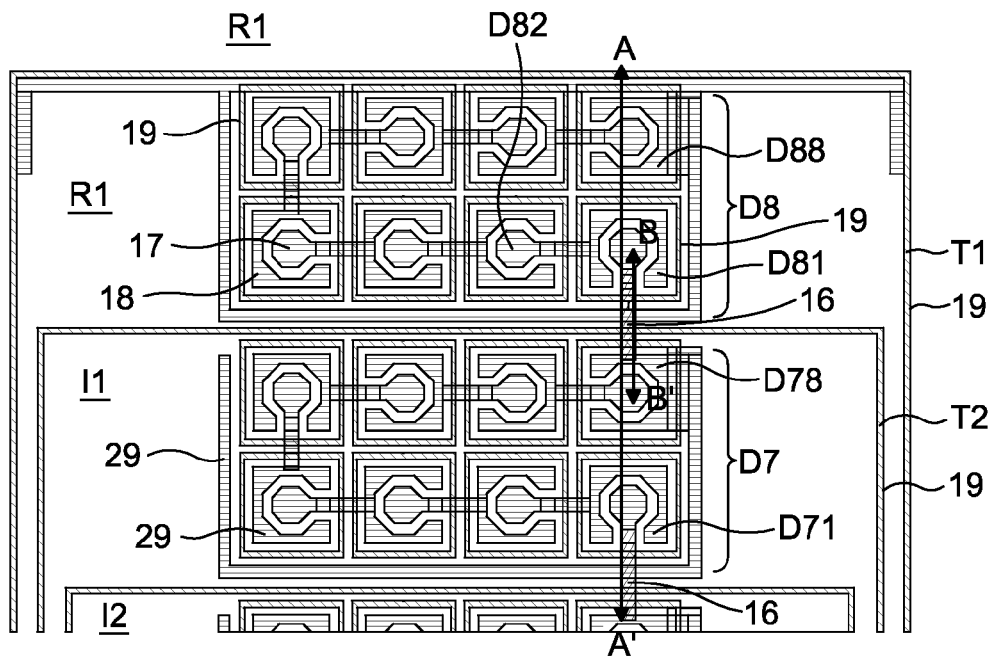
FIG. 8 is a first detail view of part of the layout of FIG. 7, including lines A-A' and B-B'.
Figure 9:
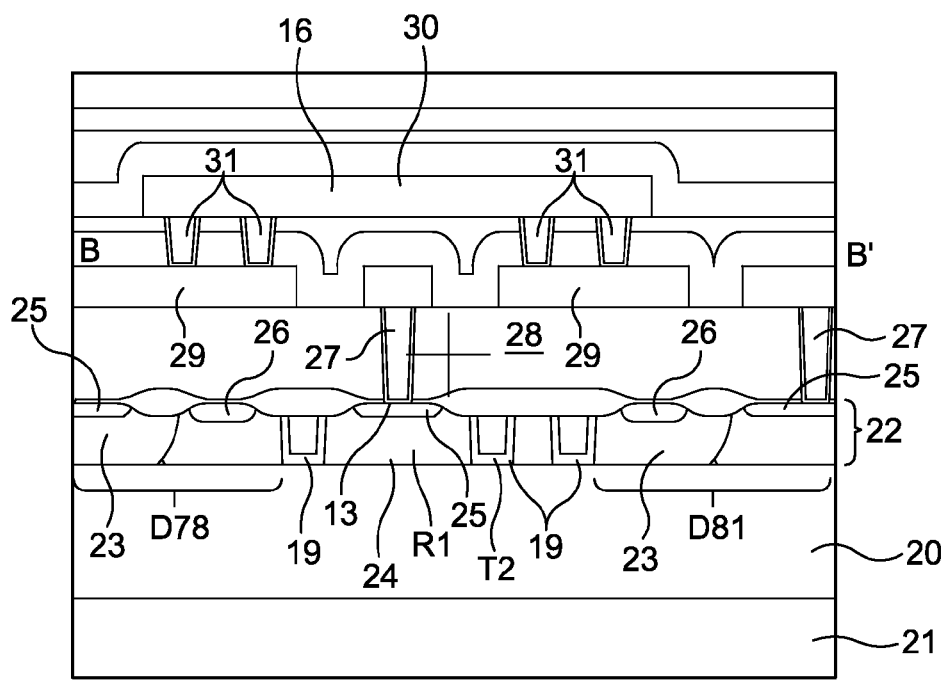
FIG. 9 is a sectional view along line B-B'.
Figure 10:
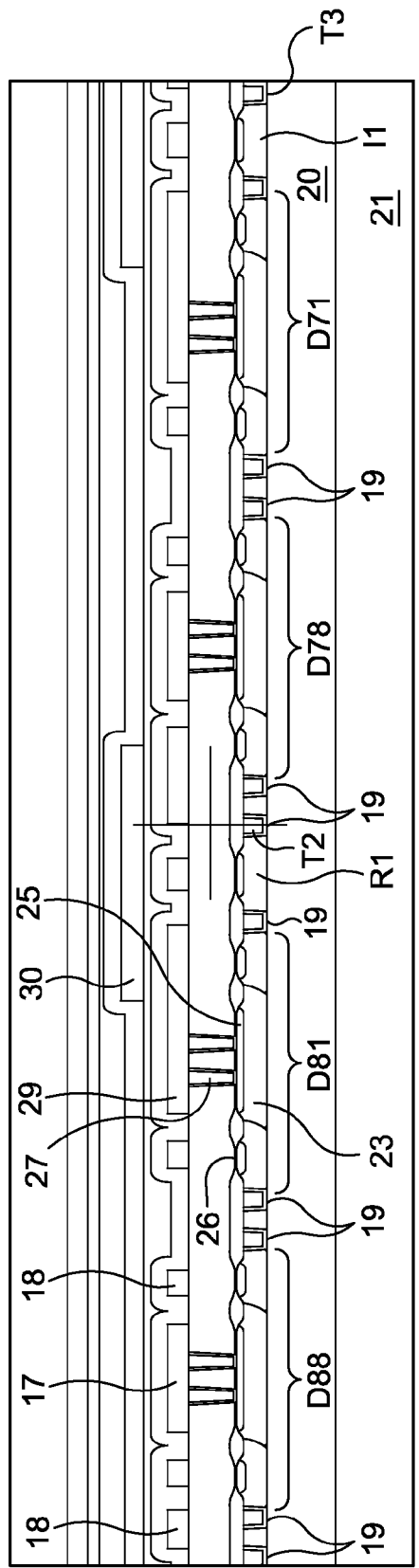
FIG. 10 is a sectional view along A-A'.

The arrangement of the diodes D1-D8 and the sub-diodes thereof can be seen more clearly in FIG. 8, which shows a detailed view of diode D7 and D8. FIGS. 9 and 10 are sectional views taken along B-B' and A-A' respectively.

Each diode D1-D8 is defined in the silicon on insulator (SOI) layer 22, which is separated from the underlying silicon substrate 21 by a buried oxide layer 20. In this embodiment the buried oxide (BOX) layer is approximately 3 microns thick, and is capable of standing off a voltage of at least 700V. The SOI layer 22 is n type silicon, and is approximately 1.5 microns thick. The invention is equally applicable to p type SOI and to SOI and BOX layers with different thicknesses (as well as to non-silicon semiconductor layers, and to semiconducting layers without a buried insulating layer).

Each sub-diode D71, D78, D81, D88, etc comprises a p doped well (pwell) 23 surrounding a central shallow low ohmic n implanted (n+) region 25. In this embodiment the pwell 23 is square, and the n+ region 25 is octagonal, but other shapes for both the pwell 23 and n+ region 25 may be used as appropriate (e.g. rectangular, oval, circular etc). A p-n junction is thereby formed between the pwell 23 and the n+ region 25. A further annular low ohmic shallow p type implant (p+) region 26 is provided around the n+ region 25 to allow the first metal layer 29 to make ohmic contact with the pwell 23. The pwell 23 is surrounded by a trench isolation 19 to provide lateral voltage isolation of the sub-diode from the surrounding semiconductor layer 22.

Figure 11:
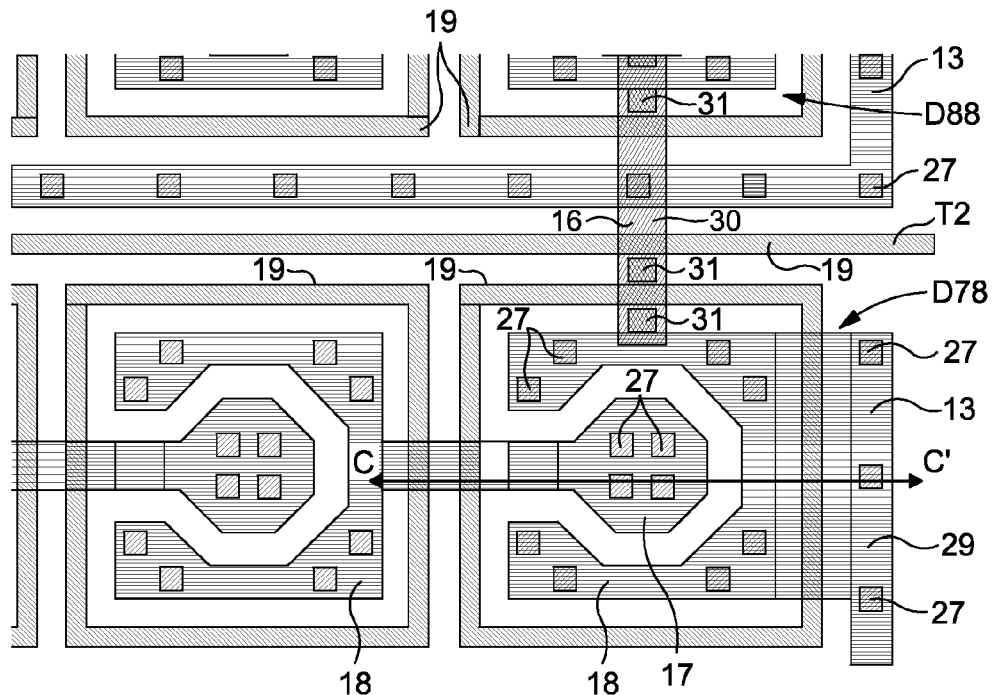
FIG. 11 is second detail view of part of the layout of FIG. 7, including line C-C'.
Figure 12:
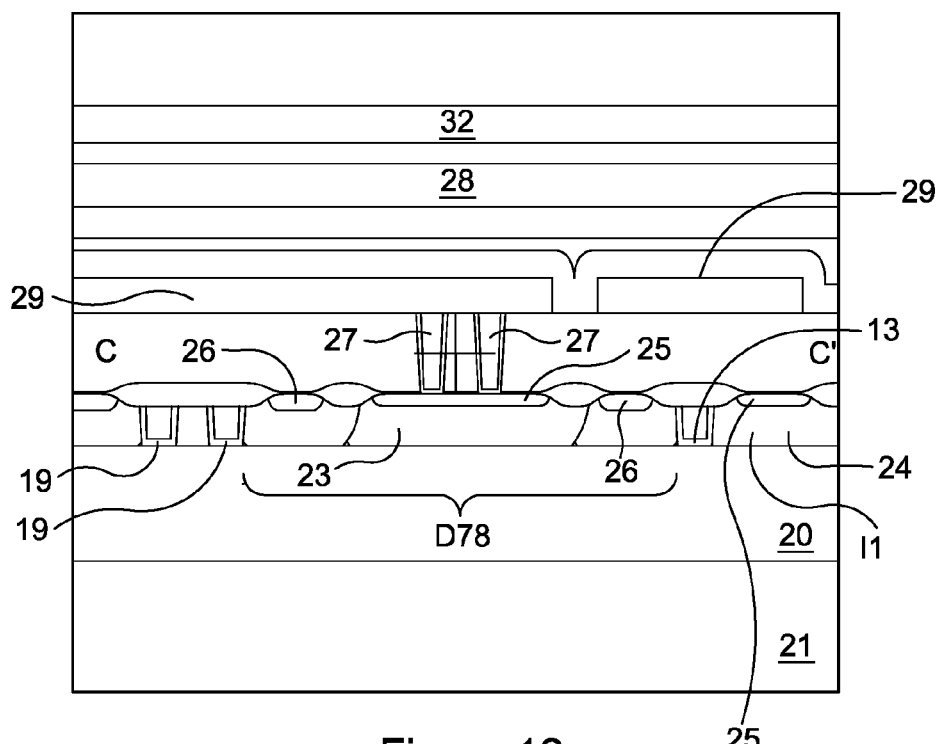
FIG. 12 is a sectional view along line C-C'.

The first metal layer 29 connects each sub-diode of each diode D1-D8 in series. For example, referring to diode D8 (shown in FIG. 8), an anode connection 18 of the first sub-diode D81 is connected to the cathode connection 17 of the next sub-diode D82. Similar connections, defined in the first metal layer 29, exist between each of the other sub-diodes. Connections between the first metal layer 29 and each n+ region 25 and p+ region 26 are defined by a first set of conducting vias 27, the layout of which are shown in FIG. 11. These conducting vias 27 can also been seen in FIGS. 9, 10 and 12.

In the final sub-diode D88 of diode D8, the anode connection 18 is also provided with a connection 15 to the first semiconductor region R1, via an n+ region 25 and nwell 24. The final sub-diode of diode D1 is provided with a similar connection 14 to the second semiconductor region R2. Each of diodes D2-D7 has, at its respective final sub-diode, a connection 13 to the intermediate semiconductor region I6-I1 within which the diode D2-D7 is formed. An example of this connection 13 is shown in more detail in FIGS. 11 and 12, in which the contact 13 from sub-diode D78 to the intermediate semiconductor region I1 is shown. Connections 15, 14 to the first and second semiconductor regions R1, R2 are made in the same way.

In the example embodiment of FIGS. 7 to 12, the semiconductor structure 100 is configured to act as a high voltage Zener diode, with a breakdown voltage of 608V (8×8× 9.5V). When a voltage of at least of 608V is provided at bondpad 33, and the connection 15 is grounded (for instance via a further bondpad, or by a connection to a further circuit on the same die), the voltage of the second semiconductor region R2 and each intermediate semiconductor region I1-I6 will be fixed at a voltage defined by the breakdown voltage of the diodes D1-D8. I1 will be fixed at 76V, I2 at 152V, I3 at 228V, I4 at 304V, I5 at 380V, I6 at 456V, and I2 at 532V.

In an alternative arrangement, a further Zener diode could be included in the arrangement of FIG. 7, connected in parallel with insulating region T1. With this approach, the region outside the insulating region T1 in FIG. 7 would be the first region, and further voltage step of 76V would be provided between this first region and the second region. The breakdown voltage of the Zener with this extra diode would be 684V. This sort of arrangement is that used in FIG. 13, in which the first region R1 is outside the last insulating region T1, and there is one more Zener diode D1-D6 than there are insulating regions T1-T5.

Although an embodiment has been shown in which the last sub-diode of each diode is connected to the semiconductor region in which the diode is formed, this is not necessarily essential. In some embodiments the first sub-diode (or any other sub-diode) may be connected to the semiconductor region in which the diode is formed.

Figure 13:
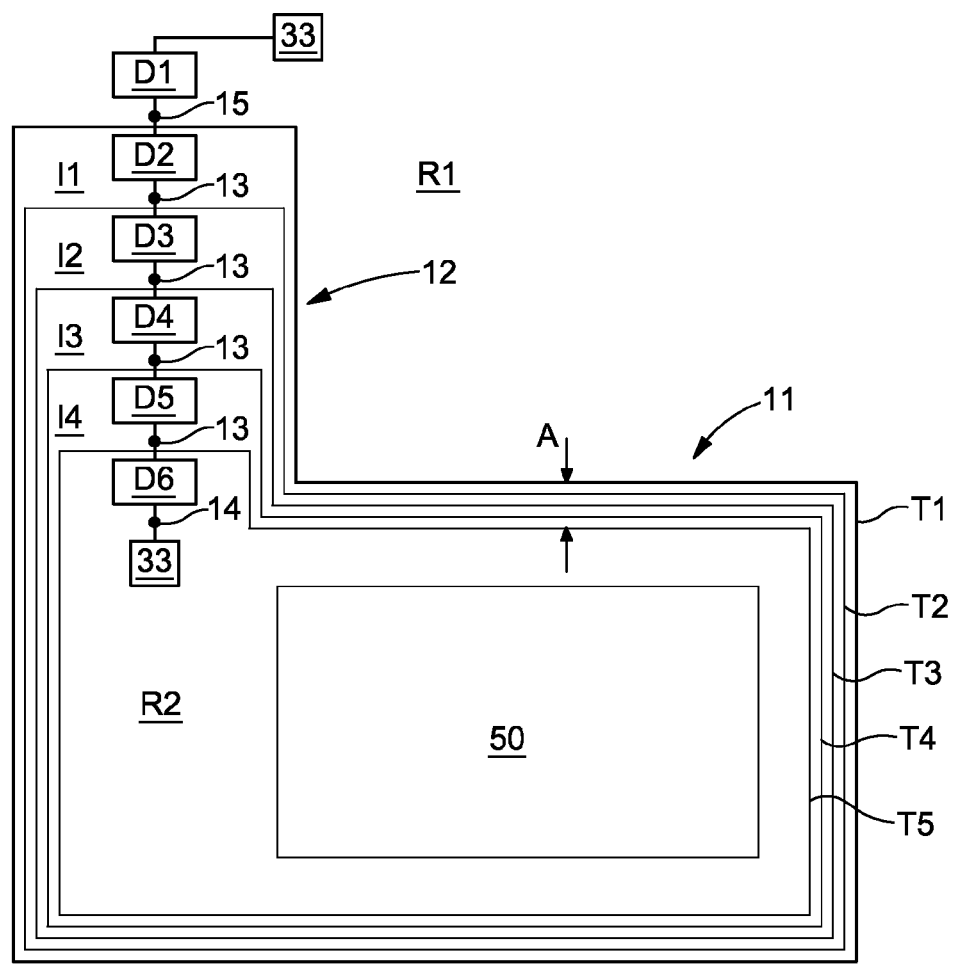
FIG. 13 is a schematic layout of a voltage isolation structure according to a fifth embodiment.

A semiconductor structure 10 according to the invention can also be configured as a high voltage isolation structure, as shown in FIG. 13. In this arrangement a first semiconductor region R1 is separated from a second high voltage semiconductor region R2 by a voltage isolator 11. The voltage isolator 11 comprises a nested series of insulating regions T1-T5. Intermediate semiconductor regions I1-I4 are defined between each adjacent pair of nested insulating regions T1-T5. A voltage control device 12, comprising a series of Zener diodes D1 to D6 is provided, which controls the voltage across each insulating region T1-T5 when a high bias voltage is placed on the second semiconductor region R2 (relative to the first region R1).

The diodes may be similar to those used in the structure of FIGS. 7-12, comprising eight sub-diodes and having a breakdown voltage of 76V. In this embodiment, the first sub-diode of each diode has a connection 13, 14, 15 to the semiconductor region in which the diode is formed, in contrast to the arrangement of FIGS. 7-12 in which the last sub-diode is connected to the semiconductor layer 22. A high voltage circuit 50 may be provided within R2, which may be biased at 400V relative to R1. The width A of the voltage isolator in this example is approximately 17 microns, which consumes a relatively small amount of die area, especially when compared with alternative high voltage isolation techniques. Furthermore, the voltage isolator 11 can be implemented within a standard semiconductor process using existing process steps and masks.

Figure 14:
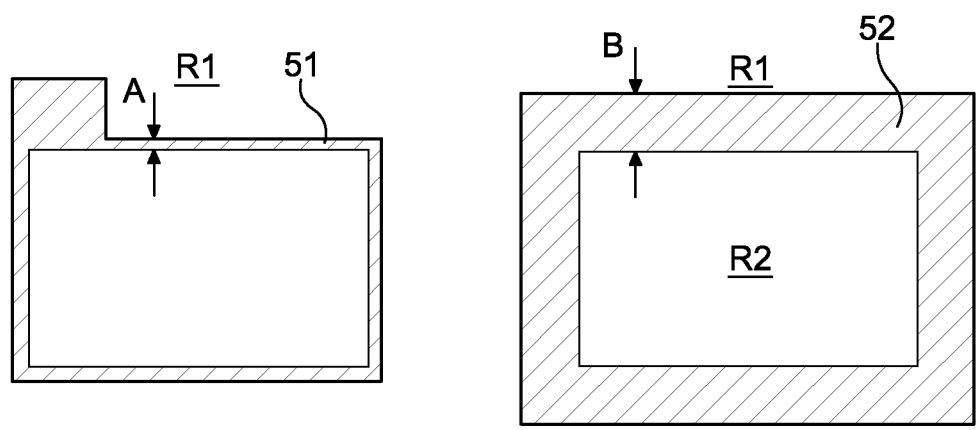
FIG. 14 is a comparison of the die area consumed by a voltage isolation structure in accordance with an embodiment and a prior art voltage isolation arrangement.

FIG. 14 shows a comparison between a voltage isolation structure according to an embodiment 51, and a prior art voltage isolation arrangement 52, in which a drift isolation region is used to provide lateral isolation. Both voltage isolation structures are designed to handle 700V, and the width A of the isolation structure 51 according to an embodiment is approximately 35 microns, compared with a width B of 130 microns for a drift isolation region 52. The die area for the isolation structure is therefore much smaller when an embodiment of the present invention is used.

Figure 15:
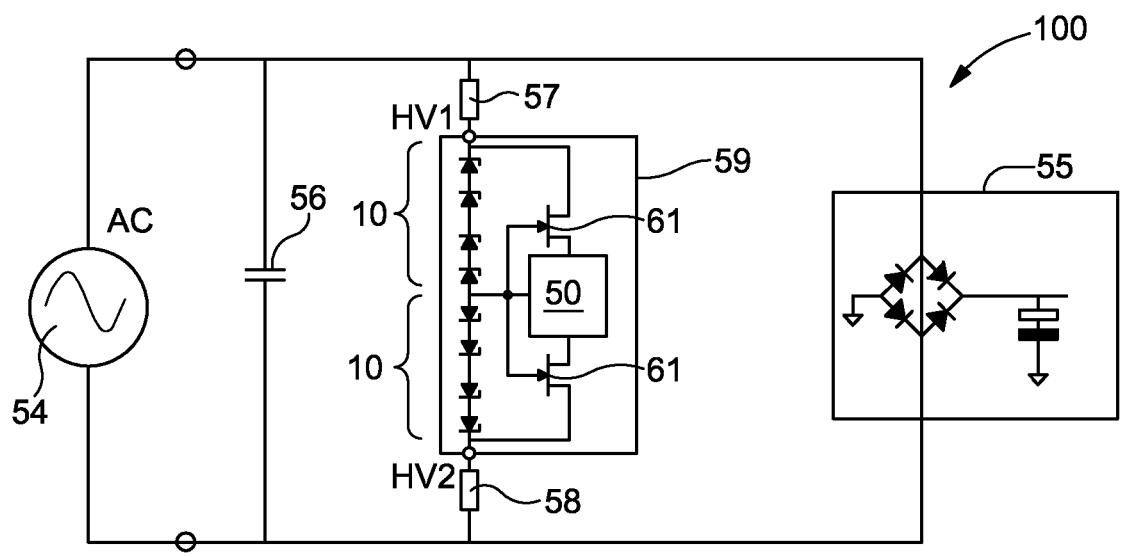
FIG. 15 is a circuit diagram of an electronic apparatus that includes a capacitor discharge circuit, according to a sixth embodiment.

FIG. 15 shows an illustrative application of a semiconductor structure according to an embodiment of the invention. An electronic apparatus 100 is shown, comprising an AC-DC converter 55, connected to an AC power supply 54. The AC power supply may supply 230V RMS alternating current, having a peak to peak voltage of approximately 320V. A filter capacitor 56 (sometimes referred to as an x-capacitor) is connected in parallel with the AC power supply 54, to shunt high frequencies from the AC power supply 54 before they reach the AC-DC convertor 55. The filter capacitor 56 handles mains voltages and is a potential safety risk to a person performing maintenance or repair on the apparatus 100. Even when AC power source is disconnected the filter capacitor 56 may store a hazardous voltage.

A capacitor discharge circuit 59 may be provided to discharge the filter capacitor 56. Such capacitor discharge circuits are conventionally protected from high voltage transients by an external passive component, such as a metal oxide varistor. Such external devices are relatively large, and occupy a significant amount of circuit board space. In the apparatus 100 of the example embodiment, the capacitor discharge circuit 59 includes an integrated over-voltage protection, comprising two semiconductor structures 10 that are each embodiments of the first aspect of the invention. The semiconductor structures 10 each comprise a series arrangement of four Zener diodes, arranged to limit the voltage on the transistors 61 and their associated control circuit 50. Further resistors 57 and 58 are provided in series with the semiconductor structures 10 to limit the current through the semiconductor structures 10 during an overvoltage event.

Semiconductor structures according to embodiments of the invention may be integrated on the same die as the transistors 61 and their associated control circuit 50, and the resistors 57 and 58 may also be included. Such an arrangement provides a more compact and lower cost arrangement than prior art devices, which require an external component to provide over-voltage protection to the capacitor discharge circuit 59.

It will readily be appreciated that semiconductor structures 10 in accordance with the invention may be applied to a range of other electronic apparatus, with similar benefits.

Figure 16:
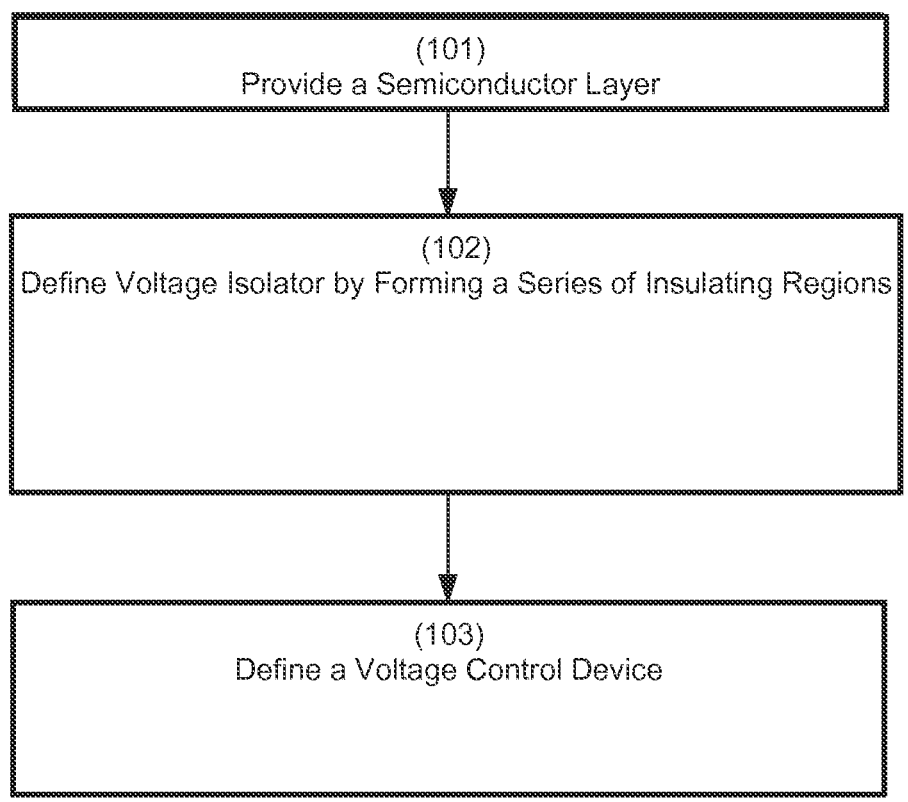
FIG. 16 is a flow diagram illustrating a method according to the fourth aspect of the invention.

Referring to FIG. 16, an example of a method of forming a semiconductor structure according to an embodiment is shown, comprising three steps 101 to 103. In the first step 101, a semiconductor layer is provided (e.g. a bulk silicon, or a semiconductor on insulator layer). In the second step 102, a voltage isolator is defined in the semiconductor layer, by forming a series of insulating regions. An intermediate region of the semiconductor layer is defined between each pair of adjacent insulating region, and a first semiconductor region is thereby defined outside the voltage isolator and a second semiconductor region is thereby defined within the voltage isolator. In the third step 103, a voltage control device is defined, comprising a conducting element connected to at least one intermediate semiconductor region, in parallel with at least one insulating region.

A number of other variations are contemplated, within the scope of the invention, as defined by the appended claims.

The invention claimed is:

1. A semiconductor structure comprising:
   a first semiconductor region,
   a second semiconductor region within the first semiconductor region, and
   a voltage isolator separating the first and second semiconductor region, the voltage isolator comprising:
      a nested series of insulating regions around the perimeter of the second semiconductor region,
      an intermediate semiconductor region between each adjacent pair of nested insulating regions, and
      a voltage control device comprising a conducting element connected to at least one intermediate semiconductor region in parallel with the at least one insulating region, so as to control a voltage across the at least one insulating region.

2. The structure of claim 1, wherein the voltage control device comprises a conducting element connected in parallel with each insulating region, so as to control the voltage across each insulating region.

3. The structure of claim 2, wherein the voltage control device comprises a plurality of conducting elements connected in series, each conducting element being connected in parallel with a corresponding insulating region, the voltage control device being connected at a first location to the first region, at a second location to the second region, and having intermediate connections between the first location and the second location to each intermediate semiconductor region.

4. The structure of claim 1, wherein the voltage control device is at least partly defined in at least one of: the first semiconductor region, an intermediate semiconductor region and the second semiconductor region.

5. The structure of claim 1, wherein the first and second semiconductor region are defined in the same semiconductor layer.

6. The structure of claim 5, wherein the semiconductor layer comprises a silicon on insulator or semiconductor on insulator layer.

7. The structure of claim 5, wherein each non-conducting region comprises a trench isolation structure.

8. The structure of claim 7, wherein the trench isolation structure is through a full thickness of the semiconductor layer.

9. The structure of claim 3, wherein each conducting element comprises a resistor.

10. The structure of claim 1, wherein each conducting element comprises a diode, or a plurality of diodes connected in series.

11. The structure of claim 10, wherein the or each diode comprises a Zener diode.

12. A semiconductor device comprising the semiconductor structure of claim 11, wherein the semiconductor structure is configured as: a high voltage Zener diode, or a high voltage clamp.

13. An electronic apparatus comprising the semiconductor device of claim 12.

14. The apparatus of claim 13, wherein the apparatus comprises an integrated circuit for discharging a mains filtering capacitor, and the semiconductor device is configured to protect the integrated circuit from overvoltage damage due to mains surge.

15. A method of fabricating the semiconductor structure of claim 1, comprising:
   providing a semiconductor layer;
   defining a first and second semiconductor region of the semiconductor layer by forming a voltage isolator around a perimeter of the second semiconductor region, separating it from the first semiconductor region, the voltage isolator comprising a nested series of isolating regions, with an intermediate region of the semiconductor layer between each adjacent pair of insulating regions;
   defining a voltage control device comprising a conducting element connected to at least one intermediate semiconductor region, in parallel with at least one insulating region, so as to control a voltage across the at least one insulating region.

* * * * *